United States Patent
Yoo et al.

(10) Patent No.: US 11,430,964 B2
(45) Date of Patent: Aug. 30, 2022

(54) ORGANIC ELECTRIC ELEMENT, DISPLAY PANEL COMPRISING THE SAME AND DISPLAY DEVICE COMPRISING THE SAME

(71) Applicant: LG Display Co., Ltd., Seoul (KR)

(72) Inventors: Seonkeun Yoo, Paju-si (KR); Shinhan Kim, Paju-si (KR); Jicheol Shin, Paju-si (KR); Seongsu Jeon, Paju-si (KR); Jeongdae Seo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 93 days.

(21) Appl. No.: 17/136,784

(22) Filed: Dec. 29, 2020

(65) Prior Publication Data

US 2021/0202871 A1 Jul. 1, 2021

(30) Foreign Application Priority Data

Dec. 31, 2019 (KR) .................. 10-2019-0180033

(51) Int. Cl.
*H01L 51/50* (2006.01)
*H01L 27/32* (2006.01)

(52) U.S. Cl.
CPC ...... *H01L 51/5004* (2013.01); *H01L 27/3244* (2013.01); *H01L 2251/552* (2013.01)

(58) Field of Classification Search
CPC combination set(s) only.
See application file for complete search history.

(56) References Cited

U.S. PATENT DOCUMENTS

2009/0206744 A1* 8/2009 Lim ............... H01L 51/5048
313/506
2017/0104172 A1 4/2017 Forrest et al.

FOREIGN PATENT DOCUMENTS

EP  3 176 844 A1  6/2017
GB  2527606 A  12/2015

* cited by examiner

*Primary Examiner* — Julio J Maldonado
*Assistant Examiner* — Mohammad A Rahman
(74) *Attorney, Agent, or Firm* — Birch, Stewart, Kolasch & Birch, LLP

(57) ABSTRACT

Provided are an organic electric element, a display panel and a display device including the organic electric element. The organic electric element includes a specific compound and satisfies a specific general formula related to energy levels of the component compounds so that they can have excellent efficiency or lifespan.

16 Claims, 6 Drawing Sheets

ORGANIC ELECTRIC ELEMENT, DISPLAY PANEL COMPRISING THE SAME AND DISPLAY DEVICE COMPRISING THE SAME

CROSS REFERENCE TO RELATED APPLICATION

This application claims priority to the Korean Patent Application No. 10-2019-0180033, filed on Dec. 31, 2019 in the Republic of Korea, the entire contents of which are hereby expressly incorporated by reference for all purposes as if fully set forth herein into the present application.

BACKGROUND

Field of the Invention

Embodiments of the present disclosure relate to an organic electric element, a display panel and a display device including the organic electric element.

Discussion of the Related Art

In general, an organic light emitting phenomenon refers to the phenomenon of converting electrical energy into light energy by using an organic material. An organic electric element refers to an electric element using the organic light emitting phenomenon.

An organic electric element using the organic light emitting phenomenon can be applied to a display device. Since the portable display device is driven by a battery, which is a limited power source, an organic electric element used in the portable display device requires excellent light emission efficiency. In addition, since the image should be displayed normally during the use of the electronic device, a long life of the organic electric element can be also needed.

In order to improve efficiency, lifespan and driving voltage in the organic electric element, research has been conducted on the organic material included in the organic electric element.

SUMMARY OF THE INVENTION

Embodiments of the present disclosure can provide an organic electric element having high efficiency or long life.

Embodiments of the present disclosure can provide a display panel having high efficiency or long life by including the above-described organic electric element.

Further, embodiments of the present disclosure can provide a display device having high efficiency or long life by including the above-described display panel.

According to an aspect, embodiments of the present disclosure can provide an organic electric element comprising a first electrode, a second electrode and an organic layer.

The organic layer is positioned between the first electrode and the second electrode.

The organic layer comprises an emitting layer and a first layer.

The first layer comprises a first compound, a second compound and a third compound.

The first compound has the HOMO (Highest Occupied Molecular Orbital) energy level of −5.5eV to −5.0eV.

The organic electric element satisfies the following general formula 1.

$$0.1 \text{ eV} \leq L_3 - L_2 \leq 0.5 \text{ eV} \tag{1}$$

In the general formula 1, $L_3$ is the LUMO (Lowest Unoccupied Molecular Orbital) energy level of the third compound, and $L_2$ is the LUMO (Lowest Unoccupied Molecular Orbital) energy level of the second compound.

Embodiments of the present disclosure can provide a display panel comprising a subpixel comprising the organic electric element.

According to another aspect, embodiments of the present disclosure can provide a display device comprising the display panel and a driving circuit for driving the display panel.

According to embodiments of the present disclosure, it is possible to provide the organic electric device having high luminous efficiency and long life by including layers having excellent hole injection property and charge control ability.

According to embodiments of the present disclosure, it is possible to provide a display panel including the organic electric device having a high luminous efficiency and long life and a display device comprising the same.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1:
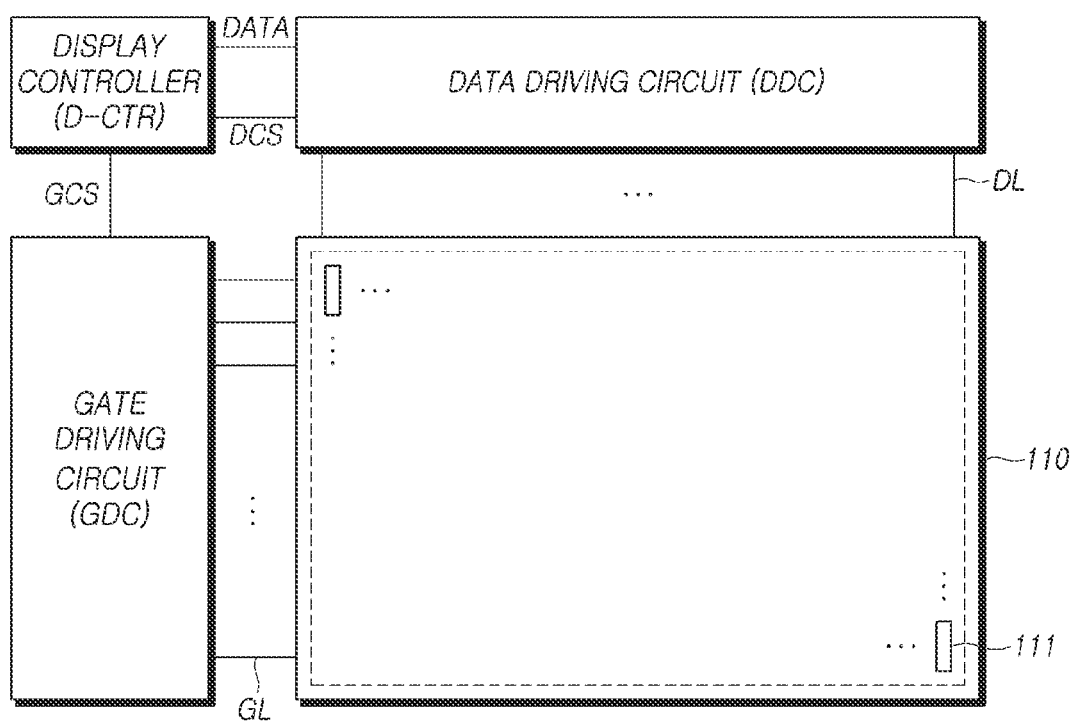
FIG. 1 is a system configuration diagram of a display device according to embodiments of the present disclosure.

In the following description of examples or embodiments of the present invention (or the present disclosure), reference will be made to the accompanying drawings in which it is shown by way of illustration specific examples or embodiments that can be implemented, and in which the same reference numerals and signs can be used to designate the same or like components even when they are shown in different accompanying drawings from one another.

Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

In the present specification, the organic electric element can preferably mean component(s) between an anode and a cathode, or an organic light emitting diode including the anode, the cathode and the component(s) positioned therebetween.

In the present specification, the organic electric element can preferably mean one of an organic electric device, the organic light emitting diode and the panel including the same, and an electronic device including the panel and a circuit. For example, the electronic device includes a display device, a lighting device, a solar cell, a portable or mobile terminal (e.g., a smart phone, a tablet, a PDA, an electronic dictionary, a PMP, etc.), a navigation terminal, a game machine, various TVs, and various computers monitor and the like, but is not limited thereto, and can be any type of device as long as the component(s) are included.

Hereinafter, exemplary embodiments of the present disclosure will be described in detail with reference to the accompanying drawings.

FIG. 1 is a system configuration diagram of a display device according to embodiments of the present disclosure. All the components of the display device according to all embodiments of the present disclosure are operatively coupled and configured.

Referring to FIG. 1, a display device 100 in accordance with embodiments of the present disclosure includes a display panel 110 in which a plurality of data lines DL and a plurality of gate lines GL are arranged and a plurality of sub-pixels 111 defined by the plurality of data lines DL and the plurality of gate lines GL is arranged, a data driving circuit DDC (or a data driver) for driving the plurality of data lines DL, a gate driving circuit GDC (or a gate driver) for driving the plurality of gate lines GL, a controller D-CTR controlling the data driving circuit DDC and the gate driving circuit GDC, and the like.

The controller D-CTR controls operations of the data driving circuit DDC and the gate driving circuit GDC by supplying respective control signals (DCS, GCS) to the data driving circuit DDC and the gate driving circuit GDC.

The controller D-CTR starts the scan of pixels according to timings processed in each frame, converts image data inputted from other devices or other image providing sources to be adapted to a data signal form used in the data driving circuit DDC and then outputs image data DATA resulted from the converting, and causes the data to be loaded into the pixels at a pre-configured time according to the scan.

The controller D-CTR can be implemented as a separate component from the data driving circuit DDC or can be integrated with data driving circuit DDC so the controller D-CTR can be implemented as an integrated circuit.

The data driving circuit DDC drives the plurality of data lines DL by providing data voltages corresponding to image data DATA received from the controller D-CTR to the data lines DL. Here, the data driving circuit DDC is sometimes referred to as a source driving circuit or a source driver.

The data driving circuit DDC can include at least one source driver integrated circuit SDIC to be implemented.

Each source driver integrated circuit SDIC can include a shift register, a latch circuit, a digital to analog converter DAC, an output buffer, and/or the like.

In some instances, each source driver integrated circuit SDIC can further include one or more analog to digital converters ADC.

The gate driving circuit GDC sequentially drives a plurality of gate lines GL by sequentially providing scan signals to the plurality of gate lines GL. Here, the gate driving circuit GDC is sometimes referred to as a scan driving circuit or a scan driver.

The gate driving circuit GDC can include at least one gate driver integrated circuit GDIC to be implemented.

Each gate driver integrated circuit GDIC can include a shift register, a level shifter, and/or the like.

Each gate driver integrated circuit GDIC can be connected to a bonding pad of the display panel 110 in a tape automated bonding (TAB) type or a chip on glass (COG) type, or be directly disposed on the display panel 110 as being implemented in a gate in panel (GIP) type. In some instances, the gate driver integrated circuit GDIC can be disposed to be integrated with the display panel 110. Further, each gate driver integrated circuit GDIC can be implemented in a chip on film (COF) type in which the gate driver integrated circuit GDIC is mounted on a film connected with the display panel 110.

According to the controlling of the controller D-CTR, the gate driving circuit GDC sequentially provides scan signals of an on-voltage or an off-voltage to the plurality of gate lines GL.

When a specific gate line is asserted by a scan signal from the gate driving circuit GDC, the data driving circuit DDC converts image data DATA received from the controller D-CTR into analog data voltages and provides the obtained analog data voltages to the plurality of data lines DL.

The data driving circuit DDC can be located on, but not limited to, only one side (e.g., an upper side or a lower side) of the display panel 110, or in some instances, be located on, but not limited to, two sides (e.g., the upper side and the lower side) of the display panel 110 according to driving schemes, panel design schemes, or the like.

The gate driving circuit GDC can be located on, but not limited to, only one side (e.g., a left side or a right side) of the panel 110, or in some instances, be located on, but not limited to, two sides (e.g., the left side and the right side) of the display panel 110 according to driving schemes, panel design schemes, or the like.

The display device 100 according to embodiments of the present disclosure can be one of various types of display devices, such as, a liquid crystal display device, an organic light emitting display device, a plasma display device, or the like.

In case the display device 100 according to embodiments of the present disclosure is an organic light emitting display device, each sub-pixel 111 arranged in the display panel 110 can include circuit components, such as an organic light emitting diode (OLED), which is a self-emissive element, a driving transistor for driving the organic light emitting diode OLED, and the like.

Types of circuit elements and the number of the circuit elements included in each subpixel 111 can be different depending on types of the panel (e.g., an LCD panel, an OLED panel, etc.), provided functions, design schemes/features, or the like.

Figure 2:
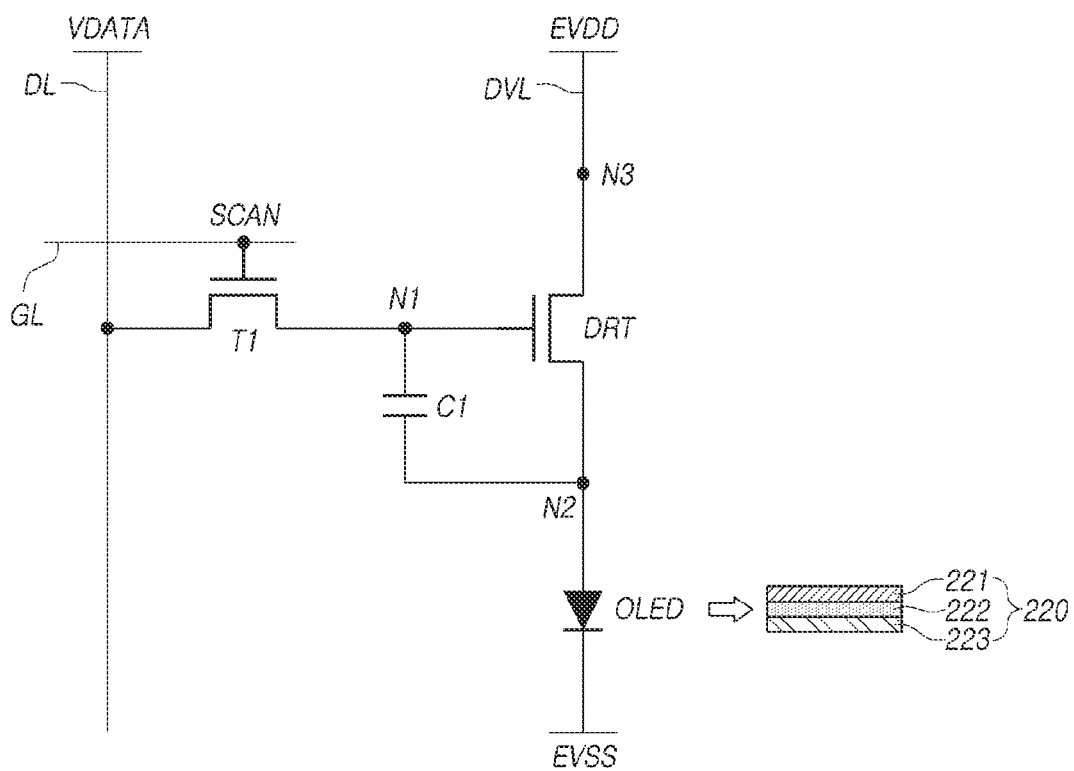
FIG. 2 and FIG. 3 are views illustrating a subpixel circuit of a display panel according to embodiments of the present disclosure.
Figure 3:
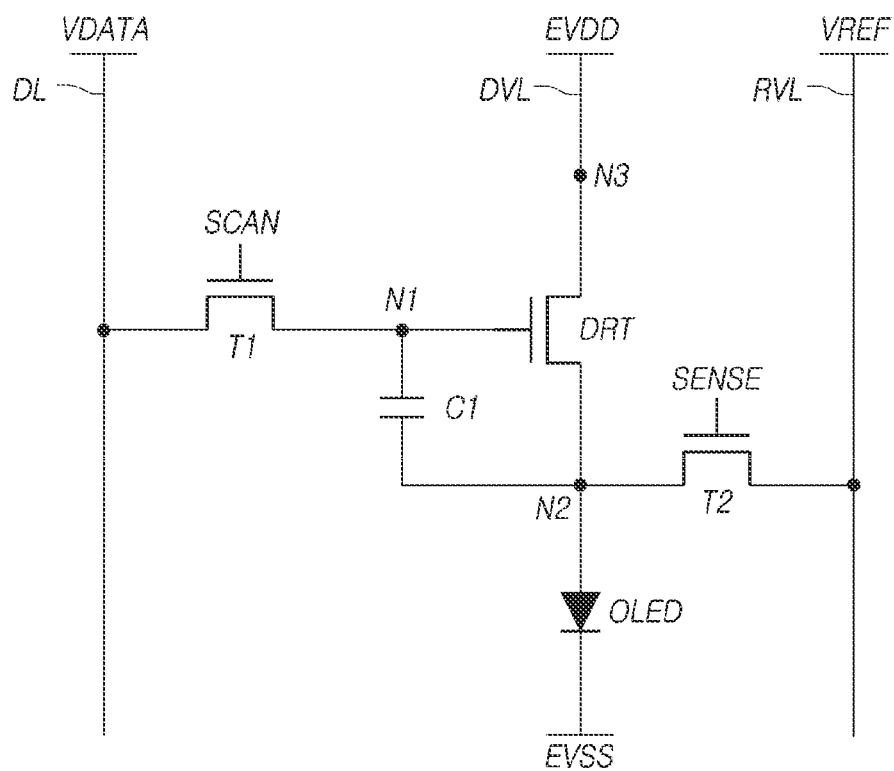

FIG. 2 and FIG. 3 are views illustrating a subpixel circuit of a display panel according to embodiments of the present disclosure.

Referring to FIG. 2 and FIG. 3, each subpixel 111 can include an organic light emitting diode OLED and a driving transistor DRT for driving the organic light emitting diode OLED as basic circuit components.

Referring to FIG. 2, each sub-pixel 111 can further include a first transistor T1 allowing a data voltage VDATA to be applied to a first node N1 corresponding to a gate node of the driving transistor DRT, and a storage capacitor C1 for remaining a data voltage VDATA corresponding to an image signal voltage or a voltage corresponding to this during one frame time.

The organic light emitting diode OLED (220) can include a first electrode 221 (an anode electrode or a cathode electrode), a light emitting layer 222, a second electrode 223 (the cathode electrode or the anode electrode), and the like.

In one embodiment, a low-level voltage EVSS can be applied to the second electrode 223 of the organic light emitting diode OLED.

The driving transistor DRT causes the organic light emitting diode OLED to be driven by providing a driving current to the organic light emitting diode OLED.

The driving transistor DRT includes a first node N1, a second node N2 and a third node N3.

The first node N1 of the driving transistor DRT can be a node corresponding to the gate node thereof, and can be electrically connected to a source node or a drain node of the first transistor T1.

The second node N2 of the driving transistor DRT can be electrically connected to the first electrode 221 of the organic light emitting diode OLED and can be a source node or a drain node.

The third node N3 of the driving transistor DRT can be the drain node or the source node as a node to which a driving voltage EVDD is applied, and can be electrically connected to a driving voltage line DVL used to supply a driving voltage EVDD.

The first transistor T1 can be electrically connected between a data line DL and the first node N1 of the driving transistor DRT and can be controlled by a scan signal SCAN that is provided through a gate line and applied to the gate node of the first transistor T1.

The storage capacitor C1 can be electrically connected between the first node N1 and the second node N2 of the driving transistor DRT.

The storage capacitor C1 is an external capacitor intentionally designed to be located outside of the driving transistor DRT, not an internal storage, such as a parasitic capacitor (e.g., a Cgs, a Cgd) that presents between the first node N1 and the second node N2 of the driving transistor DRT.

Referring to another example as shown in FIG. 3, each sub-pixel 111 disposed on the display panel according to the present embodiments includes not only an organic light emitting device OLED, a driving transistor DRT, a first transistor T1, and a storage capacitor C1 but also the second transistor T2.

The second transistor T2 is electrically connected between a second node N2 of the driving transistor DRT and a reference voltage line RVL that supplies a reference voltage VREF, and can be controlled by receiving a sensing signal SENSE, which is a type of a scan signal to its gate node.

By further including the above-described second transistor T2, the voltage state of the second node N2 of the driving transistor DRT in the subpixel 111 can be effectively controlled.

The second transistor T2 is turned on by the sensing signal SENSE to apply the reference voltage VREF supplied through the reference voltage line RVL to the second node N2 of the driving transistor DRT.

Meanwhile, the scan signal SCAN and the sensing signal SENSE can be separate gate signals. In this case, the scan signal SCAN and the sensing signal SENSE can be applied to the gate node of the first transistor T1 and the gate node of the second transistor T2, respectively, through different gate lines. 1721 In some cases, the scan signal SCAN and the sensing signal SENSE can be the same gate signal. In this case, the scan signal SCAN and the sensing signal SENSE can be commonly applied to the gate node of the first transistor T1 and the gate node of the second transistor T2 through the same gate line.

Figure 4:
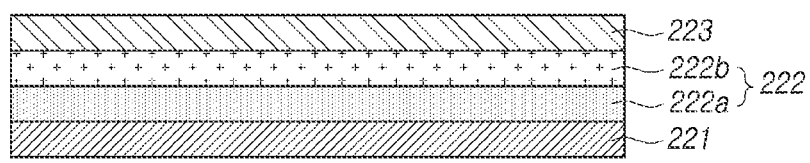
FIG. 4 to FIG. 6 are schematic cross-sectional views of an organic electric device according to embodiments of the present disclosure.

FIG. 4 is a cross-sectional view of an organic electric device according to the embodiments of the present disclosure. The organic electric devices of FIGS. 4-6 can be used in the display device according to one or more embodiments of the present disclosure.

Referring to FIG. 4, an organic electric element 220 according to the embodiments includes a first electrode 221 and a second electrode 223, an organic layer 222 positioned therebetween.

The first electrode 221 can be an anode and the second electrode 223 can be a cathode. In the case of an inverted type, the first electrode 221 can be a cathode and the second electrode 223 can be an anode.

For example, the first electrode 221 can be a transparent electrode, and the second electrode 223 can be a reflective electrode. In another example, the first electrode 221 can be a reflective electrode, and the second electrode 223 can be a transparent electrode.

The organic layer 222 can include a plurality of layers which is located between the first electrode 221 and the second electrode 223 and includes an organic material.

The organic layer includes a light emitting layer 222b, and a first layer 222a.

The organic electric element 220 can be a tandem organic electric element including a plurality of stacks each including a light emitting layer 222b. The plurality of light emitting layers can be made of the same material as each other, or can be made of different materials from each other.

The light emitting layer 222b is a layer in which energy generated by recombination of electrons and holes is emitted as light, and can include, for example, a host material and a dopant.

The first layer 222a can be positioned between the light emitting layer 222b and the first electrode 221. In this example, the first electrode 221 can be an anode electrode, and the first layer 222a can be a hole transport layer or a hole injection layer. When the first layer 222a is positioned between the light emitting layer 222b and the first electrode 221, the organic electric device can have high efficiency or long life.

The first layer 222a includes a first compound, a second compound and a third compound. The first layer 222a can be one layer including the first compound, the second compound and the third compound, or can be composed of a plurality of layers each containing one or more of the first compound, the second compound and the third compound. For example, the first layer 222a can include a first compound layer including the first compound, a second compound layer including the second compound and a third compound layer including the third compound. In FIG. 4, the first layer 222a is illustrated as one layer, but the first layer 222a of the embodiments is not limited to a single layer structure.

Further, the organic electric element 320 can further at least one of a hole injection layer, a hole transport layer, an electron transport layer, and an electron injection layer.

The first compound has the HOMO (Highest Occupied Molecular Orbital) energy level of −5.5 eV to −5.0 eV. When the HOMO energy level of the first compound satisfies the above range, the first layer including it can have excellent hole injection property and charge control ability.

The second compound and the third compound included in organic electric element satisfy the following general formula 1.

$$0.1\ eV \le L_3 - L_2 \le 0.5\ eV \quad (1)$$

In the general formula 1, $L_3$ is the LUMO (Lowest Unoccupied Molecular Orbital) energy level of the third compound, and $L_2$ is the LUMO (Lowest Unoccupied Molecular Orbital) energy level of the second compound.

The lower limit of $L_3 - L_2$ defined in the general formula 1 can be 0.1 eV or more, or 0.2 eV or more.

The upper limit of $L_3 - L_2$ defined in the general formula 1 can be 1.5 eV or less, or 0.4 eV or less.

If the second compound and the third compound satisfy the general formula 1, the first layer including them can have excellent hole injection and charge control ability.

The second compound can have the LUMO energy level of −4.0 eV or less. The upper limit of the LUMO energy level of the second compound can be, for example, −4.5 eV or less, or −5.0 eV or less. The lower limit of the LUMO energy level of the second compound can be, for example, −6.0 eV or more, or −5.5 eV or more.

When the LUMO energy level of the second compound satisfies the above range, the first layer has excellent hole transport property and charge control ability so that the organic electric device can have excellent efficiency and life.

The third compound can have an LUMO energy level of −4.0 eV or less. The upper limit of the LUMO energy level of the third compound can be, for example, −4.5 eV or less. The lower limit of the LUMO energy level of the third compound can be, for example, −6.0 eV or more, or −5.5 eV or more.

When the LUMO energy level of the third compound satisfies the above range, the first layer has excellent hole transport property and charge control ability so that the organic electric device can have excellent efficiency and life.

The LUMO energy level of the third compound can be greater than the HOMO energy level of the first compound. When the LUMO energy level of the third compound and the HOMO energy level of the first compound satisfy the above relationship, the first layer has excellent hole transport property and charge control ability so that the organic electric device can have excellent efficiency and life.

The first compound and the third compound included in organic electric element satisfy the following general formula 2.

$$2.0\ eV \le L_1 - L_3 \le 3.0\ eV \quad (2)$$

In the general formula 2, $L_1$ is the LUMO energy level of the first compound.

The lower limit of $L_1 - L_3$ defined in the general formula 2 can be 2.2 eV or more, or 2.4 eV or more. The upper limit of $L_3 - L_2$ defined in the general formula 1 can be 2.8 eV or less, or 2.7 eV or less.

If the first compound and the third compound satisfy the general formula 2, the first layer including them can have excellent hole injection property and charge control ability. PAU The first compound and the third compound included in organic electric element satisfy the following general formula 3.

$$0.2\ eV \le L_3 - H_1 \le 1.0\ eV \quad (3)$$

In the general formula 2, $H_1$ is the HOMO energy level of the first compound.

The lower limit of $L_3 - H_1$ defined in the general formula 2 can be 2.2 eV or more, or 2.4 eV or more. The upper limit of $L_3 - H_1$ defined in the general formula 1 can be 0.8 eV or less, or 0.6 eV or less.

If the first compound and the third compound satisfy the general formula 3, the first layer including them can have excellent hole injection property and charge control ability.

The first compound can be a material that satisfies the energy level described above, and can be, for example, a tertiary amine-based material.

The tertiary amine-based material is, for example, N,N-diphenyl-N,N'-bis(3-methylphenyl)-1,1'-biphenyl-4,4'-diamine (TPD), NPD(N,N'-Di(1-naphthyl)-N, N'-diphenyl-(1, 1'-biphenyl)-4,4'-diamine), MTDATA, 1,3-bis(N-carbazolyl) benzene (mCP), CuPC, TCTA, tris (trifluorovinyl ether)-tris(4-carbazoyl-9-yl-phenyl)amine (TFV-TCTA), tris[4-(diethylamino)phenyl]amine, N-(biphenyl-4-yl)-9,9-dimethyl-N-(4 -(9-phenyl-9H-carbazol-3-yl)phenyl)-9H-fluoren-2-amine, tri-p-tolylamine, N-[1,1'-biphenyl]-4-yl-9,9-diMethyl-N-[4-(9-phenyl-9H-carbazol-3-yl)phenyl]-amine, 4,4'-bis(N-carbazolyl)-1,1'-biphenyl(CBP) and/or 1,1-bis(4-(N,N'-di(ptolyl)amino)phenyl)cyclohexane(TAPC), or the like. In another example, the first compound can be NPD.

The second compound can be a material that satisfies the energy level described above, and can be, for example, a cyanocarbon-based material.

The cyanocarbon-based material can be, for example, a compound derived from tetracyanoquinodimethane, and can be tetrafluoro-tetracyanoquinodimethane.

The third compound can be a material that satisfies the energy level described above, and can be, for example, an indacene-based material.

The indacene-based material can be, for example, one or more of the following compounds.

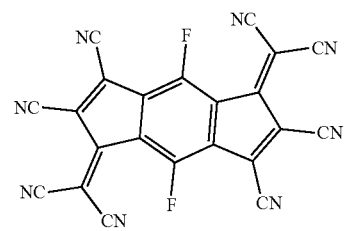

CCM1

-continued

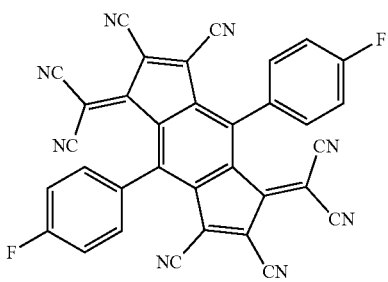
CCM2

The first layer 422a can include the first compound as a host compound. Therefore, the first layer 422a includes the second compound and the third compound wherein the sum of the weight of the second compound and the weight of the third compound can be 0.1% to 50% by weight according to the total weight of the first compound, the second compound, and the third compound.

Further, the first compound included in the first layer 422a can be a host compound, and the second compound and the third compound can be dopants. Since the first layer 422a includes the above-described first compound as the host, and the second compound and the third compound as the dopants, the first layer 422a has excellent hole transport property and charge control ability so that so that the organic electric device can have excellent efficiency and life.

The ratio (A:B) of the weight (A) of the second compound and the weight (B) of the third compound included in the first layer 422a can be (1:99) to (99:1). When the second compound and the third compound satisfy the above ratio, the first layer has excellent hole transport property and charge control ability so that so that the organic electric device can have excellent efficiency and life.

The thickness of the first layer 422a is not particularly limited, but can be, for example, 50 mm 2 to 500 mm 2. When the thickness of the first layer 422a satisfies the above range, the first layer 422a has excellent hole transport property and excellent charge control property so that the organic electric device can have excellent efficiency and life.

The organic layer of the organic electric device according to embodiments of the present disclosure can include two or more light emitting layers.

Figure 5:
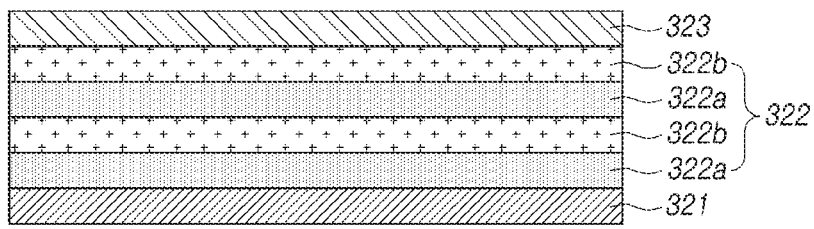

FIG. 5 is a cross-sectional view of another example of an organic electric device according to the embodiments of the present disclosure.

Referring to FIG. 5, an organic electric element 320 according to the embodiments includes a first electrode 321 and a second electrode 323, an organic layer 322 positioned therebetween.

The organic layer 322 includes a light emitting layer 322b and a first layer 322a.

The organic layer 322 can include two or more light emitting layers 322b. The light emitting layers 322b can be made of the same material as each other, or can be made of different materials from each other.

The first layer 322a can be positioned between the first electrode 321 and the light emitting layer 322b adjacent to the first electrode 321. The light emitting layer 322b adjacent to the first electrode 321 means the light emitting layer 322b closest to the first electrode 321 among the plurality of light emitting layers 322b. In this example, the first electrode 321 can be an anode electrode, and the first layer 322a can be a hole transport layer or a hole injection layer. Since the first layer 322a is positioned as described above, the organic electric device 320 can have high efficiency or long life.

The first layer 322a can be positioned between the plurality of the light emitting layers 322b. Accordingly, the organic layer 222 of the organic electric device 320 can include at least one first layer 322a. When the first layer 322a is plural, each of the first layers 322a can be made of the same material, or can be made of different materials.

When the first layer 322a is positioned between the plurality of light emitting layers 322b, the first layer 322a can be a charge generating layer, and in particular, a P-type charge generating layer. When the organic electric device 320 includes the charge generating layer, the charge generating layer can include an N-type charge generating layer and the first layer 322a which is a P-type charge generating layer.

The first layer 322a can be positioned between the first electrode 321 and the light emitting layer 322b adjacent thereto as well as the light emitting layers 322b. In this example, the first electrode 321 can be an anode electrode, and the first layer 322a positioned as described above can be a hole injection layer or a hole transport layer.

When the first layer 322a is a plurality of layers, each of the first layers 322a includes the first compound, the second compound, and the third compound. In addition, the first compounds included in each first layer can be different from each other or the same, and the second compound and the third compound are also the same.

When a plurality of the first layers 322a are included, the first compound, the second compound, and the third compounds included in one first layer 322a have the same energy level as described in the embodiments illustrated in FIG. 4 above. Therefore, each of the first layers 322a can have excellent hole transport property and electronic control ability.

In FIG. 5, the first layer 322a is positioned between the first electrode 321 and the light emitting layer 322b, or between the light emitting layers 322b, but the embodiments are not limited thereto. The embodiments can include only one first layer 322a.

Figure 6:
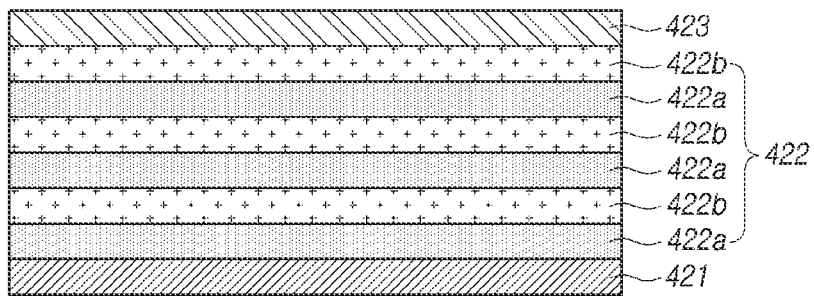

FIG. 6 is a cross-sectional view of another example of an organic electric device according to the embodiments of the present disclosure.

Referring to FIG. 6, an organic electric element 420 according to the embodiments includes a first electrode 421 and a second electrode 423, an organic layer 422 positioned therebetween.

The organic layer 422 includes a light emitting layer 422b and a first layer 422a.

The organic electric element 420 can include two or more light emitting layers 422b. In FIG. 6, the organic layer 422 can include three light emitting layers 422b as one example. The light emitting layers 422b can be made of the same material as each other, or can be made of different materials from each other.

Even if the three light emitting layers 422b are included, the position of the first layer 422a is similar to it of the first layer 322a with reference to FIG. 5.

In FIG. 6, the first layer 422a is positioned between the first electrode 421 and the light emitting layer 422b, or between the light emitting layers 422b, but the embodiments are limited thereto. The embodiments of the present disclosure can include only one first layer 422a.

When the plurality of the first layers 322a are included, the first compound, the second compound, and the third compounds included in one first layer 322a have the same energy level as described in the embodiments illustrated in FIG. 4 above. Therefore, each of the first layers 322a can have excellent hole transport property and electronic control ability.

In the embodiments of the present disclosure, an organic electric device including four or more light emitting layers is also included, and a person skilled in the art can understand the structure and the position of the first electrodes, the organic layer, and the second layer in this case with reference to the FIGS. 4 to 6.

The organic electric elements 220, 320 and 420 according to the embodiments can be a front emission type, a back emission type, or a double-sided emission type, depending on the material used.

Also, the organic layer 222, 322 and 422 can include an additional layer in addition to the first layer 222a, 322a and 422a, and the light emitting layer 222b, 322b and 422b. For example, a hole injection layer, a hole transport layer, an electron transport layer, an electron injection layer, a hole transport layer, and a charge generating layer that can be commonly applied in the field of organic electric devices can be included in the organic layer 222, 322 and 422.

Other embodiments of the present disclosure can provide the display panel 100.

The display panel 110 includes a plurality of sub-pixels 111, each of at least one of the plurality of sub-pixels including one of the aforementioned organic electric elements 220, 320, and 420.

In the display panel 110 according to the present embodiments, since the organic electrical elements 220, 320, and 420 are the same as the organic electric devices 220, 320, and 420 according to the embodiments described above, thus the detailed description thereof will be omitted.

In addition, since the display panel 110 and the sub-pixel 111 according to embodiments have been described above, thus a detailed description thereof will be omitted. PAM Other embodiments of the present disclosure can provide a display device 100.

The display device 100 includes the above-described display panel 110 and a driving circuit for driving the above-described display panel 110.

In the display device 100 according to the present embodiments, the display panel 110 is the same as the display panel 110 according to the above-described embodiments, so a description thereof will be omitted or will be brief.

In addition, since the driving circuit for driving the display panel according to embodiments has been described above, a description thereof will be omitted or will be brief.

Hereinafter, examples of the synthesis of the compound represented by the chemical formula 1 and the compound represented by the chemical formula 2 and examples of manufacturing an organic electric element according to the embodiments will be specifically described with reference to the embodiment, but the embodiments are not limited to the following examples.

Manufacturing Evaluation of Organic Electric Element
Embodiments 1

After washing a glass substrate coated with ITO (indium tin oxide) to a thickness of 1,000 Å, the substrate is washed with a solvent such as isopropyl alcohol, acetone or methanol and dried.

A hole injection layer was formed by thermal vacuum deposition of a hole injection material (HI-01) to a thickness of 10 nm on the prepared ITO transparent electrode, followed by thermal vacuum deposition of a hole transport material (HT1) to a thickness of 80 nm to form a hole transport layer. Thereafter, BH1 and BD1 were doped 5% with a host and a dopant material, respectively, and thermally vacuum-deposited to a thickness of 30 nm to form a first emitting layer.

Subsequently, the electron transport material ET2 was thermally vacuum-deposited to a thickness of 10 nm to form an electron transport layer, and the N-type charge generating material NC1 was thermally vacuum-deposited to a thickness of 20 nm to form an N-type charge generating layer. Subsequently, the first layer was thermally vacuum-deposited to a thickness of 25 nm using PH1 as the first compound, and doped with 5% of PD1 as the second compound and doped with 5% of CCM1 as the third compound.

Subsequently, HT1 as a hole transport material was thermally vacuum-deposited to a thickness of 5 nm, and then PhHA and PhHB as a host material was thermally vacuum-deposited at a ratio of 5:5, followed by doping 20% of PhD2 as a dopant.

Subsequently, an ET1 compound as an electron transport layer material was thermally vacuum-deposited to a thickness of 20 nm, and then LiF and Al were thermally vacuum-deposited to a thickness of 4 nm and 100 nm to form a cathode, thereby fabricating an organic electric device.

The following compounds are compounds used in the Manufacturing of the above-mentioned organic electric device.

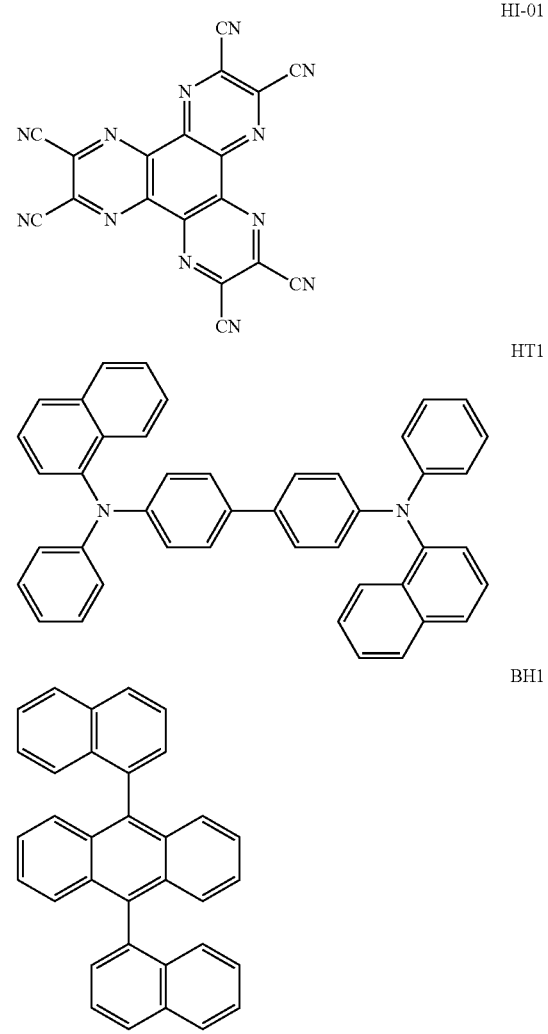

BD1
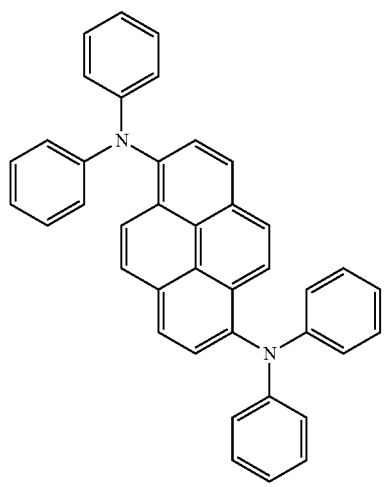
ET2
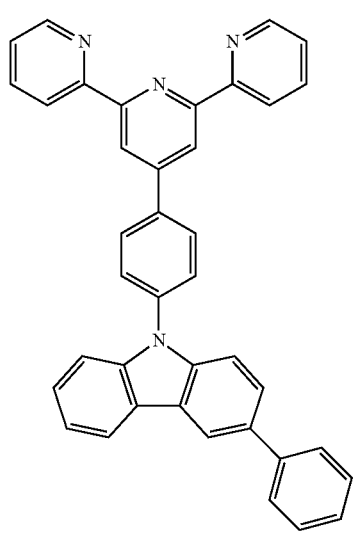
ET1
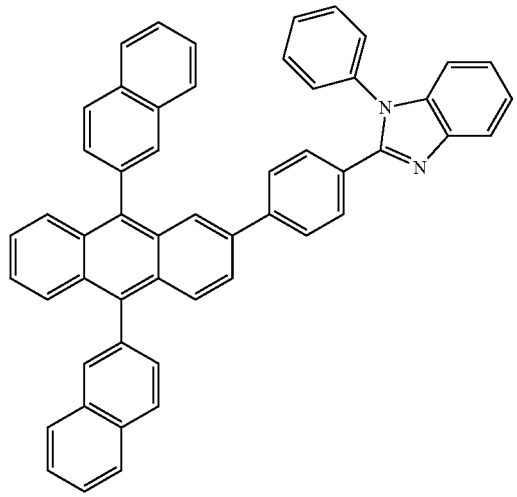
NC1
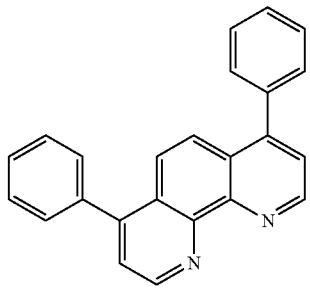
PH1
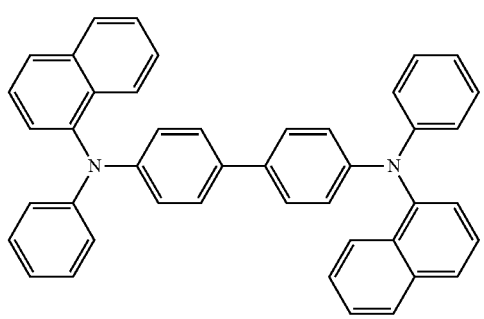
PD1
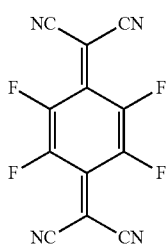
CCM1
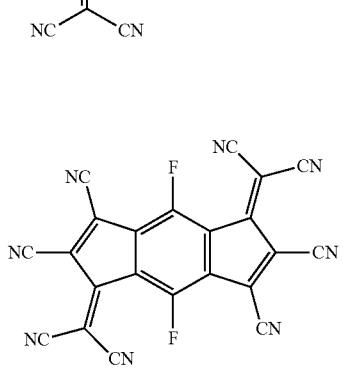

PhH A

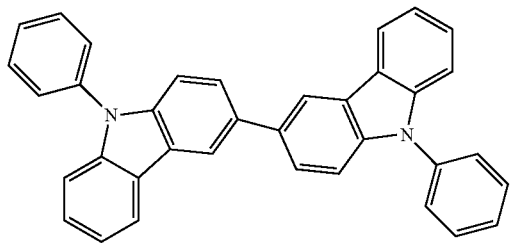

PhH B

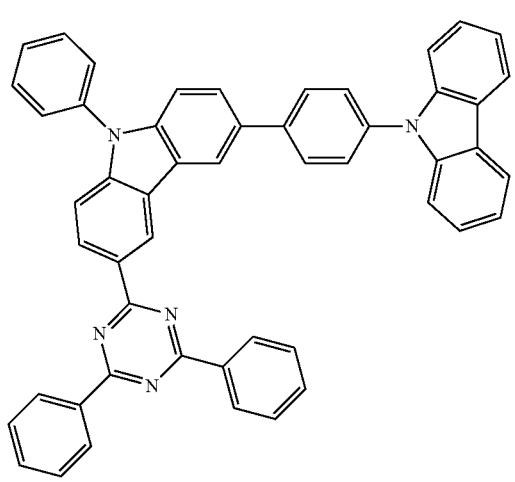

PhD2

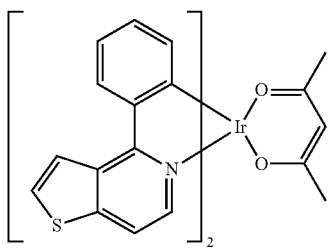

Embodiment 2

In the above mentioned Embodiment 1, an organic electric device was manufactured in the same manner as in the Embodiment 1, except that the following CCM2 as the third compound was used instead of CCM1.

CCM2

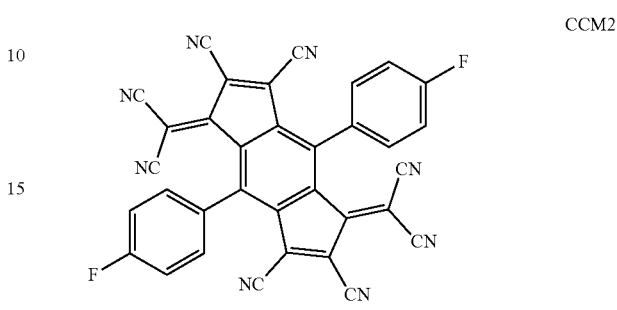

Comparative Example 1

The organic electric element was manufactured in the same manner as in the Embodiment 1, except that the following HI-01 as the third compound was used instead of CCM1.

Table 1 shows the HOMO energy levels and LUMO energy levels of some of the compounds used in the Embodiments and Comparative Example.

TABLE 1

|  | HOMO (eV) | LUMO (eV) |
|---|---|---|
| PH1 | −5.4 | −2.4 |
| PD1 | — | −5.25 |
| HI-01 | — | −4.21 |
| CCM1 | — | −5.02 |
| CCM2 | — | −4.85 |

Table 2 shows the performances of the manufactured organic electric elements in the Embodiments and Comparative Example.

TABLE 2

|  | First Layer | driving voltage (ΔV) | efficiency (sample/ Ref, %) | Lifespan (sample/ Ref, %) | General formula 1 (eV) | General formula 2 (eV) | General formula 3 (eV) |
|---|---|---|---|---|---|---|---|
| Embodiment 1 | PH1 + PD1 (5%) + CCM1 (5%) | −0.5 V | 102% | 138% | 0.23 | 2.62 | 0.38 |
| Embodiment 2 | PH1 + PD1 (5%) + CCM2 (5%) | −0.5 V | 102% | 151% | 0.4 | 2.45 | 0.55 |
| Comparative Example 1 | PH1 + PD1 (5%) + HI-01 (5%) | +1.1 V | 84% | 72% | 1.04 | 1.81 | 1.19 |

As can be seen from the result of the table 2, since the organic electric element according to the embodiments 1 and 2 includes the first layer including the first compound, the second compound and the third compound, it can have excellent efficiency or lifespan compared to the organic electric element of the Comparative Example 1.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only.

For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. An organic electric element comprising:
   a first electrode;
   a second electrode; and
   an organic layer positioned between the first electrode and the second electrode, and comprising a first layer and a light emitting layer,
   wherein the first layer comprises a first compound, a second compound, and a third compound, and
   the first compound has a HOMO (Highest Occupied Molecular Orbital) energy level of −5.5 eV to −5.0 eV,
   the organic electric element satisfies a following general formula 1:

$$0.1\ eV \leq L_3 - L_2 \leq 0.5\ eV \quad (1)$$

where, in the general formula 1, $L_3$ is a LUMO (Lowest Unoccupied Molecular Orbital) energy level of the third compound, and $L_2$ is a LUMO energy level of the second compound.

2. The organic electric element according to claim 1, wherein the second compound and the third compound have the LUMO energy level of −4.0 eV or less, respectively.

3. The organic electric element according to claim 1, wherein the LUMO energy level of the third compound is greater than the HOMO energy level of the first compound.

4. The organic electric element according to claim 1, wherein the first compound and the third compound included in organic electric element satisfy a following general formula 2:

$$2.0\ eV \leq L_1 - L_3 \leq 3.0\ eV \quad (2)$$

where, in the general formula 2, $L_1$ is the LUMO energy level of the first compound.

5. The organic electric element according to claim 1, wherein the first compound and the third compound included in organic electric element satisfy a following general formula 2:

$$0.2\ eV \leq L_3 - H_1 \leq 1.0\ eV \quad (2)$$

where, in the general formula 3, $H_1$ is the HOMO energy level of the first compound.

6. The organic electric element according to claim 1, wherein the first layer is positioned between the first electrode and the light emitting layer.

7. The organic electric element according to claim 1, wherein the first layer is positioned between the first electrode and the light emitting layer.

8. The organic electric element according to claim 1, wherein the organic layer comprises two or more light emitting layers, and the first layer is positioned between the first electrode and one of the two or more light emitting layers.

9. The organic electric element according to claim 1, wherein the organic layer comprises two or more light emitting layers, and the first layer is positioned between the light emitting layers.

10. The organic electric element according to claim 1, wherein the first compound includes a tertiary amine-based material.

11. The organic electric element according to claim 1 wherein the second compound is a cyanocarbon-based material.

12. The organic electric element according to claim 1 wherein the third compound includes an indacene-based material.

13. The organic electric element according to claim 1, wherein a sum of a weight of the second compound and a weight of the third compound is approximately 0.1% to 50% by weight according to a total weight of the first compound, the second compound, and the third compound.

14. The organic electric element according to claim 1, wherein a ratio (A:B) of a weight (A) of the second compound and a weight (B) of the third compound included in the first layer is approximately (1:99) to (99:1).

15. A display panel comprising a plurality of subpixels, wherein each of at least one of the plurality of subpixels comprises the organic electric element of claim 1.

16. A display device comprising;
    the display panel of claim 15; and
    a driving circuit configured to drive the display panel.

* * * * *